United States Patent [19]

Shirakawa et al.

[11] Patent Number: 5,286,658
[45] Date of Patent: Feb. 15, 1994

[54] PROCESS FOR PRODUCING SEMICONDUCTOR DEVICE

[75] Inventors: Yoshimi Shirakawa; Hiroshi Kaneta, both of Kawasaki, Japan

[73] Assignee: Fujitsu Limited, Kawasaki, Japan

[21] Appl. No.: 846,061

[22] Filed: Mar. 5, 1992

[30] Foreign Application Priority Data

Mar. 5, 1991 [JP] Japan ............... 3-038676
Mar. 13, 1991 [JP] Japan ............... 3-048190
Sep. 4, 1991 [JP] Japan ............... 3-224068

[51] Int. Cl.$^5$ ............... H01L 21/322; H01L 21/324
[52] U.S. Cl. ............... 437/10; 437/247; 437/946; 148/DIG. 60
[58] Field of Search ............... 437/10, 946, 247; 148/33.2, DIG. 60, DIG. 3

[56] References Cited

U.S. PATENT DOCUMENTS

| | | | |
|---|---|---|---|
| 4,220,483 | 9/1980 | Cazcarra | 437/10 |
| 4,314,595 | 2/1982 | Yamamoto et al. | 437/10 |
| 4,432,809 | 2/1984 | Chye et al. | 437/10 |
| 4,437,922 | 3/1984 | Bischoff et al. | 437/10 |
| 4,622,082 | 11/1986 | Dyson et al. | 148/DIG. 60 |
| 4,868,133 | 9/1989 | Huber | 437/10 |
| 4,994,399 | 2/1991 | Aoki | 437/10 |
| 5,096,839 | 3/1992 | Amai et al. | 437/946 |

FOREIGN PATENT DOCUMENTS

| | | | |
|---|---|---|---|
| 58-159334 | 9/1983 | Japan | 437/10 |
| 61-15335 | 1/1986 | Japan | |
| 62-290140 | 12/1987 | Japan | 437/10 |

OTHER PUBLICATIONS

Ghandi, "VLSI Fabrication Principles", John Wiley & Sons, 1983, p. 29.
Wolf et al., "Silicon Processing for the VLSI Era, vol. 1: Process Technology", Lattice Press, 1986, pp. 18–21 and 66–70.
Craven et al, "Internal Gettering in Silicon", Solid State Technology/Jul. 1981, pp. 55–61.

Primary Examiner—Robert Kunemund
Assistant Examiner—Ourmazd S. Ojan
Attorney, Agent, or Firm—Staas & Halsey

[57] ABSTRACT

A semiconductor device is produced by a process for intrinsic gettering heat treatment of a silicon crystal in which the concentration of C—O complex defects destined to form seeds for oxygen precipitation in the silicon crystal is increased or an amount of oxygen precipitate in the silicon crystal is controlled, to thereby eliminate the dispersion of the amount from one crystal to another. In the heat treatment of the silicon crystal, the amount of oxygen precipitation can be controlled with a high accuracy.

8 Claims, 12 Drawing Sheets

Fig. 17(a)

| CLASSIFI-CATION | TIME ZONE | A₁ | A₀ | A₂ | A₃ |
|---|---|---|---|---|---|
| X₁ | 0 ~ 10 | 1 | 2 | 3 | 4 |
| X₂ | 10 ~ 50 | 1 | 3 | 2 | 4 |
| X₃ | 50 ~ | 1 | 4 | 2 | 3 |

\* PEAK WAVE NUMBER $(cm^{-1})$
$A_1$ 1104 ± 4
$A_0$ 1108 ± 4
$A_2$ 1099 ± 4
$A_3$ 1112 ± 4

Fig. 17(b)

| CLASSIFI-CATION | TIME ZONE | B₁ | B₀ | B₃ | B₂ |
|---|---|---|---|---|---|
| Y₁ | 0 ~ 4 | 2 | — | 1 | 3 |
| Y₂ | 4 ~ 8 | 1 | — | 2 | 3 |
| Y₃ | 8 ~ 30 | 1 | — | 3 | 2 |
| Y₄ | 30 ~ | 2 | — | 3 | 1 |

\* PEAK WAVE NUMBER $(cm^{-1})$
$B_1$ 1052 ± 4
$B_0$ 1060 ± 4
$B_2$ 1026 ± 4
$B_3$ 1012 ± 4

PROCESS FOR PRODUCING SEMICONDUCTOR DEVICE

BACKGROUND OF THE INVENTION

1. Field of the Invention

The invention relates to a process for the production of a semiconductor device, and more particularly, to a process for an intrinsic gettering heat treatment (hereinafter referred to as "IG heat-treating method") of a silicon crystal substrate.

2. Description of the Related Art

Silicon crystals used in semiconductor devices contain impurity oxygen in a supersoluble amount, and when these crystals are subjected to a heat treatment, the impurity oxygen is precipitated as an oxide of silicon. It is well known that the defect due to this precipitate causes a gettering of metal impurities which have mingled with the crystal, and this gettering action is utilized in the actual production of semiconductor devices. When this precipitate occurs in the zone of element, however, it impairs the element characteristics.

Therefore, it is important to establish an IG heat-treating method capable of controlling, with a high accuracy, the position and speed of the precipitation of the impurity oxygen in a silicon crystal substrate.

It is known that the speed and amount of the precipitate of the impurity oxygen in the silicon crystal are augmented by the presence of impurity carbon in the crystal, and a utilization of this action of the impurity carbon ought to facilitate the precipitation of the impurity oxygen in the silicon crystal having a low oxygen concentration.

Nevertheless, since the mechanism of the precipitation of the impurity oxygen has not been elucidated, the effect of the impurity carbon cannot be accurately incorporated in the conditions for the IG heat treatment, and thus no method has yet been established for the IG heat treatment of the silicon crystal containing impurity carbon.

FIG. 5 illustrates the conventional process for the IG heat treatment. First, a heat treatment is performed at a temperature exceeding 1,000° C., specifically at 1,100° C., for a period of 1.5 hours to form a denuded zone, then a heat treatment is performed at a temperature of from 650° to 800° C., specifically at 700° C., for example, for a period of four hours, to form a seed for the precipitation of oxygen, and thereafter a treatment for the elevation of the temperature to 1,100° C. is performed to induce growth of the seed for oxygen precipitation.

When a silicon crystal containing impurity carbon is subjected to a heat treatment, the impurity oxygen (Oi) approaches the impurity carbon (Cs) and forms a C—O complex defect, which constitutes itself a seed for the precipitation of oxygen. The present inventors have found that when the heat treatment is performed at a low temperature, the C—O complex defect increases. The experiment which has led to this knowledge will be described in detail below.

FIG. 3 is a graph obtained by performing a heat treatment at a varying temperature of from 450° C. to 800° C. on a silicon crystal having an impurity oxygen (Oi) concentration of 15 ppm and an impurity carbon (Cs) concentration of 6 ppm and plotting the results of the heat treatment as to the duration of heat treatment relative to the concentration of C—O complex consequently formed in the silicon crystal, with the temperature of heat treatment as a parameter. The C—O complex concentration is increased by the heat treatment performed at a temperature not exceeding 600° C. and it is conversely decreased and rapidly brought to an equilibrium state by the heat treatment performed at a temperature exceeding 600° C. It has been confirmed that the C—O complex concentration in the equilibrium state is governed by the impurity oxygen (Oi) concentration and the impurity carbon (Cs) concentration in the silicon crystal and the temperature of the heat treatment.

Thus, it has been established that, when the heat treatment is carried out at the temperature conventionally used for this heat treatment, the concentration of the C—O complex serving as the seed for oxygen precipitation is decreased and an ample oxygen precipitation is not obtained.

On the other hand, in the production of semiconductor devices using silicon single crystals, more often than not such silicon crystals produced by the CZ (Czokralski) process under conditions calculated for the concentration [Oi] of impurity oxygen (Oi) to exceed about 28 ppm are used. In these silicon crystals, the concentration [Cs] of impurity carbon (Cs) is generally controlled to the lowest possible level, specifically below 0.5 ppm (see, for example, Japanese Unexamined Patent Publication No. 61-15335). In the classification of crystals by the concentration [Oi] of impurity oxygen (Oi) and the concentration [Cs] of impurity carbon (Cs), these silicon crystals belong to the region indicated as (a) in FIG. 10. These silicon crystals of high-oxygen and low-carbon concentrations are selectively used for the following reason.

(1) First, to utilize the intrinsic gettering effect due to precipitation of oxygen, these crystals must possess an oxidation precipitation tendency exceeding a certain degree. The impurity carbon (Cs) has an action of promoting precipitation of oxygen. When the concentration [Cs] of the impurity carbon (Cs) is below a certain fixed value (0.5 ppm), the concentration [Oi] of the impurity oxygen (Oi) must exceed a certain fixed value (about 28 ppm) to obtain a sufficient amount of oxygen precipitation. In other words, no sufficient oxygen precipitation is obtained with the crystals of low-oxygen and low-carbon concentrations falling in the region indicated as (d) in FIG. 10.

(2) The concentration [Cs] of the impurity carbon (Cs) must be controlled to a fixed value because the oxygen precipitation in a high-oxygen crystal, whose concentration [Oi] of the impurity oxygen (Oi) exceeds 28 ppm, is extremely sensitive to the concentration [Cs] of the impurity carbon (Cs). By the standard of the current techniques, however, a regulation of this fixed value to the lowest possible level (below 0.5 ppm) is the simplest and economically advantageous approach. To be specific, the silicon crystals belonging to the region indicated as (a) in FIG. 10 are easier to manufacture and economically more advantageous than the silicon crystals belonging to the region indicated as (c).

(3) Since the impurity carbon (Cs) is effective in promoting oxygen precipitation, the use of crystals having low-oxygen and high-carbon concentrations belonging to the region indicated as (b) in FIG. 10 raises no problem exclusively from the viewpoint of oxygen precipitation. When these crystals are used, however, the effect of carbon on the oxygen precipitation, namely the amount of carbon-containing oxygen precipitation seed defect, must be controlled. Heretofore, this problem has been evaded as an unusually complicated matter. Where an accurate control of precipitation is required, therefore, these crystals of low-oxygen and high-carbon concentrations have not been selected for use.

The fact that the crystals of high-oxygen and low-carbon concentration [belonging to the region (a) in FIG. 10] have been disseminated more than the crystals of low-oxygen and high-carbon concentrations [belonging to the region (b) in FIG. 10], as reviewed on the basis of the levels of current techniques and studies, may be ascribed rather to the circumstances of the technical development to date than to the essential difference between them.

The conventional technique using crystals of high-oxygen and low-carbon concentrations has the disadvantage that, even when one and the same heat treatment for oxygen precipitation is performed on silicon crystals containing impurity oxygen (Oi) in one and the same concentration, the amount of precipitation is prone to dispersion. In the case of crystals having a high-oxygen concentration, a sufficient oxygen precipitation takes place even in the absence of carbon. The precipitation of this kind (non-carbon precipitation) is governed in a large measure by the amount of the seed for non-carbon precipitation. Since the silicon crystals neither always assume a fixed amount of thermal hysterisis during the course of their production nor produce a fixed amount of seed for non-carbon precipitation, the amount of oxygen precipitation is apt to dispersion.

At present, since the seed for non-carbon precipitation defies direct observation, there is no way of estimating the density of the seed for non-carbon precipitation in a given silicon crystal in advance of the step of heat treatment for oxygen precipitation. It is, therefore, difficult to obtain ample repression of the dispersion in the amount of oxygen precipitation in crystals having high-oxygen and low-carbon concentrations. Note, this dispersion occurs most frequently in crystals having the concentration [Oi] of the impurity oxygen (Oi) of from 28 to 34 ppm, which are used prevalently for devices.

Further, the conventional methods of heat treatment of a silicon crystal as previously mentioned have a disadvantage in that an accurate control of the amount of oxygen precipitation in the silicon crystal is difficult because the amount of oxygen precipitate produced in the silicon crystal is dispersed when the thermal hysteresis exerted on the silicon crystal is varied. This drawback has caused variations in the gettering ability among the individual substrates.

SUMMARY OF THE INVENTION

An object of the invention resides in providing a process for increasing the concentration of the C—O complex defects destined to form seeds for oxygen precipitation in a silicon crystal thereby accomplishing intrinsic gettering efficiently.

Another object of the invention resides in providing a process for producing a semiconductor device by intrinsic gettering heat treatment of a silicon crystal, which process is capable of controlling the amount of oxygen precipitate in a silicon crystal thereby eliminating the dispersion of this amount from one crystal to another and improving the quality of a semiconductor device.

A further object of the present invention is to provide a process for heat treatment of a semiconductor crystal, which process is capable of controlling with high accuracy the amount of oxygen precipitation in a silicon crystal.

Thus, the present invention provides a process for the production of a semiconductor device, comprising a step of performing a heat treatment at a temperature of from 950° C. to 1,250° C. for a period of from one to four hours on a silicon crystal having an impurity carbon concentration exceeding 1.0 ppm and not exceeding the solid solution limit thereby forming a denuded zone therein, a step of performing a heat treatment at a temperature of from 350° C. to 600° C. for a period of from one to 24 hours on the silicon crystal having the denuded zone formed therein thereby forming a complex defect of impurity oxygen and impurity carbon therein, and a step of performing a heat treatment on the silicon crystal having the complex defect formed therein by the elevation of the temperature of the silicon crystal at a temperature increasing rate such that no nucleus is broken, preferably from 0.2° to 3.0° C./min. to a level of from 900° C. to 1,250° C., to thereby effect intrinsic gettering. This process is more effectively implemented when the set of the step of performing a heat treatment at a temperature of from 350° C. to 600° C. for a period of from one to 24 hours on the silicon crystal and the step of performing a heat treatment on the silicon crystal by the elevation of the temperature of the silicon crystal at a temperature increasing rate such that no nucleus is broken, preferably from 0.2° to 3.0° C./min. to a level of from 900° C. to 1,250° C. is repeated a plurality of times.

According to another aspect of the invention, there is provided a process for the production of a semiconductor device by an intrinsic gettering heat treatment of a silicon crystal, comprising analyzing a silicon crystal to thereby determine the concentration of impurity oxygen [Oi] and the concentration of impurity carbon [Cs] contained therein, calculating the expression:

$$A = \frac{[CO]_{eq}}{[Oi] \times [Cs]}$$

wherein A stands for the coefficient for determining the temperature of a heat treatment to be performed on the silicon crystal, providing that the numerical value of the coefficient is expressed by the denomination of 1/ppm and [CO] for the concentration of a C—O complex generated within the silicon crystal in consequence of the heat treatment, to thereby find the coefficient A for determining the temperature of the heat treatment, calculating the expression, $1,000/(T+273) = \log_{10} A + 3.9$, wherein T stands for the temperature (°C.) of the heat treatment to be performed on the silicon crystal, to thereby find the temperature T for the heat treatment to be performed on the silicon crystal, performing a heat treatment at the temperature T for a period not exceeding four hours on the silicon crystal, adjusting the concentration of a C—O complex defect contained in the silicon crystal, and thereafter, performing a heating treatment for precipitation of oxygen. The time, t, required for the step of heat treatment performed at the temperature T for adjustment of the concentration of the C—O component defect is preferably decided by calculation of the expression, $t = B\{1 - \exp(-C/T)\}$, wherein B and C stand for constants for giving 0.3 hour and four hours as the time t respectively for 1,000° C. and 500° C. as the temperature T.

According to a further aspect of the present invention, there is provided a process for a heat treatment of semiconductor crystals comprising determining defective states in silicon crystals having impurity carbon concentrations exceeding 1 ppm by a measurement at a temperature lower than the liquefied nitrogen temperature, selecting the crystals by comparing the intensities of infrared absorption peaks consequently appearing in the 1,000 to 1,120 cm$^{-1}$ zone, and subjecting only such crystals of one and the same sort or only such crystals of mutually approximating sorts to the heat treatment.

BRIEF DESCRIPTION OF THE DRAWINGS

FIGS. 17(a) and (b) are diagrams showing relative magnitudes of infrared absorption peak intensities of Group A and Group B in separate time zones of heat treatment.

DESCRIPTION OF THE PREFERRED EMBODIMENTS

Figure 3:
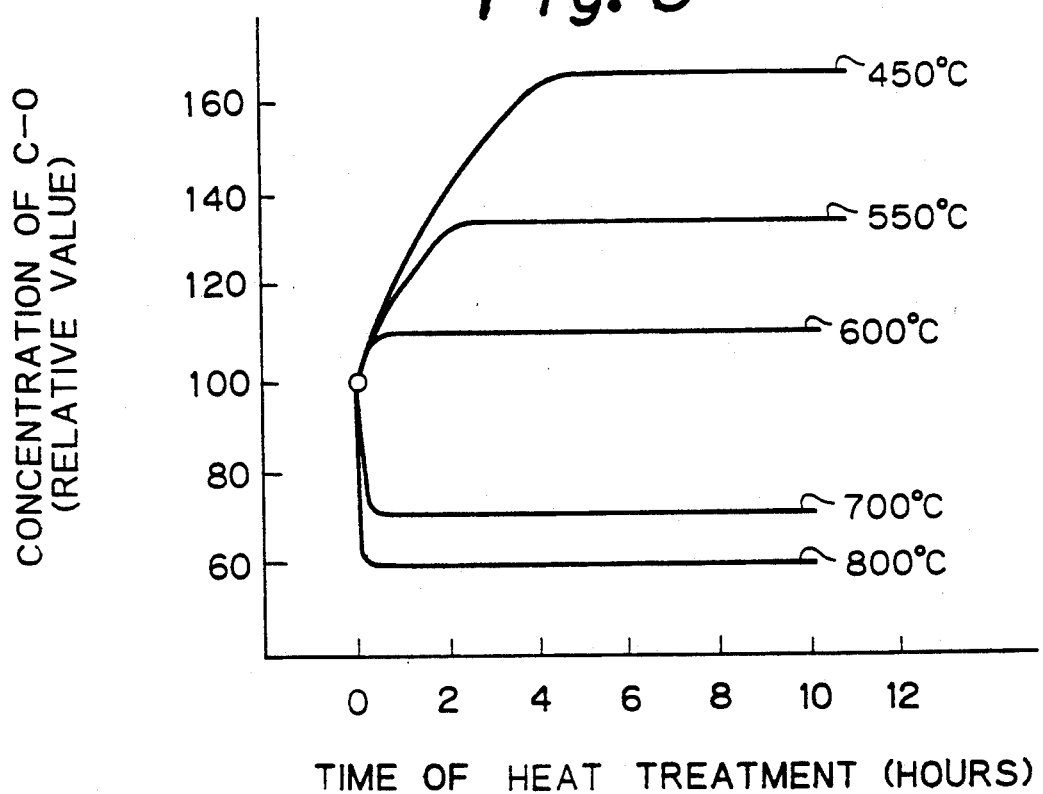
FIG. 3 is a graph showing the relationship between the C—O concentration and the time of heat treatment, with the temperature of heat treatment as a parameter.

When a heat treatment is performed at a low temperature on a silicon crystal containing impurity carbon, the concentration of the C—O complex in this crystal increases, as is clearly noted from the test results shown in FIG. 3.

When the concentration of the C—O complex destined to form the seed for oxygen precipitation is increased, the amount of the oxygen precipitate to be formed in the step of heat treatment to be subsequently performed will increase.

Figure 4:
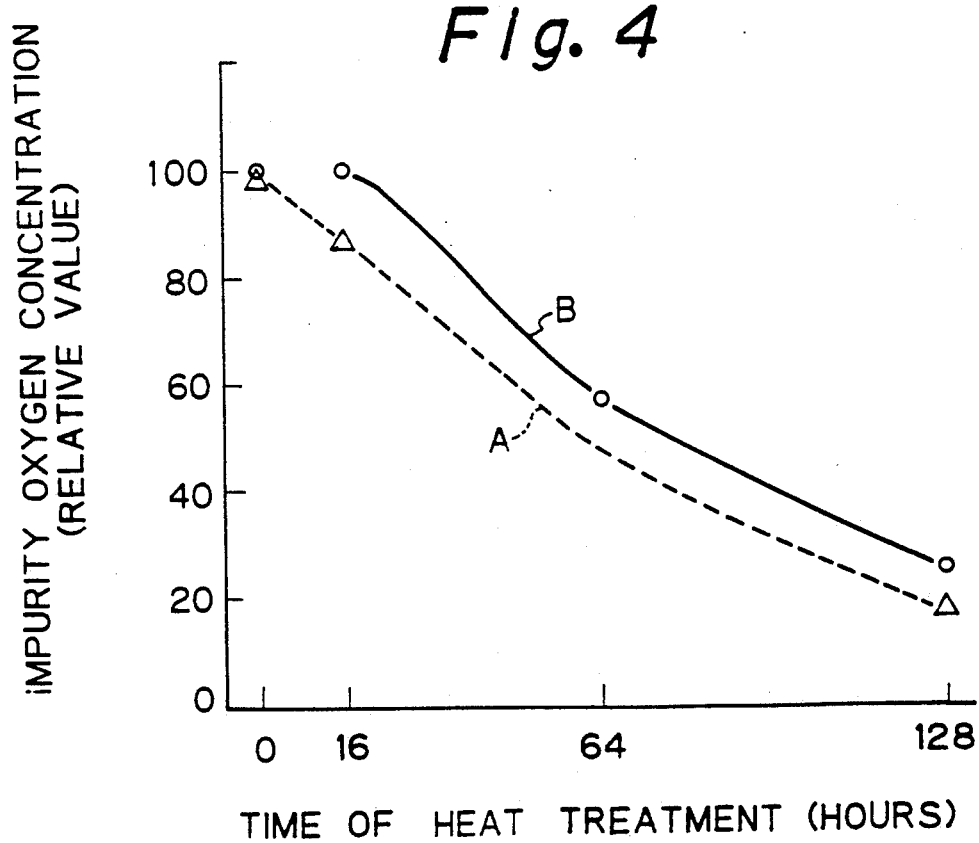
FIG. 4 is a graph showing the relationship between the concentration of impurity oxygen and the time of heat treatment.
Figure 5:
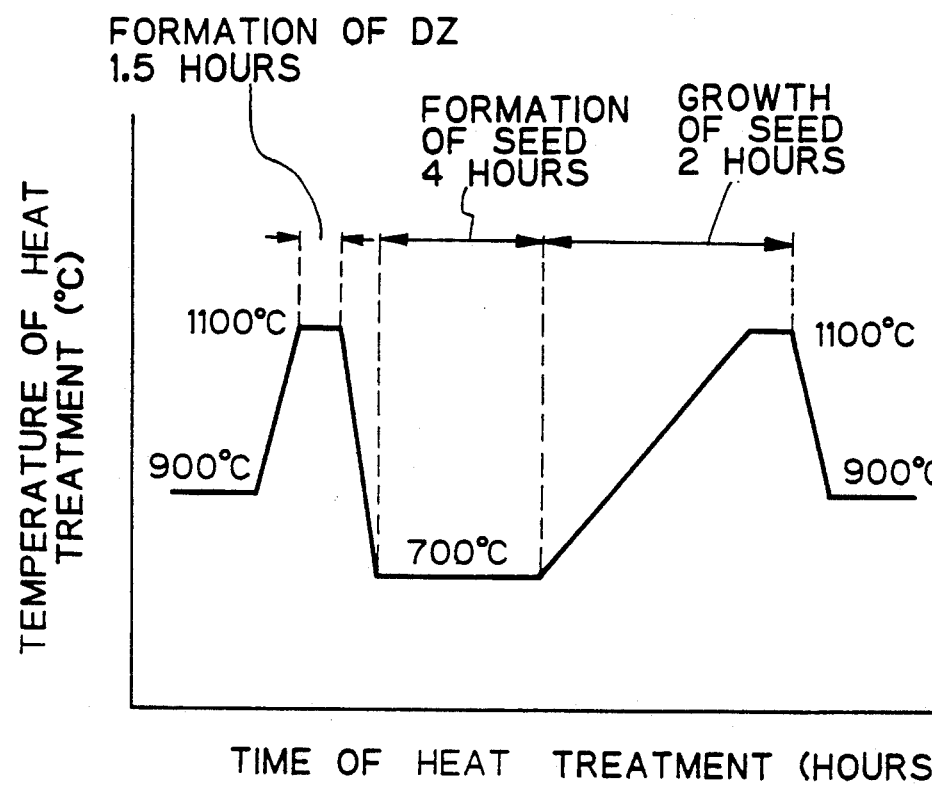
FIG. 5 is a diagram of a conventional process for IG heat treatment.

FIG. 4 shows the relationship between the time of a heat treatment performed at a temperature of 700° C. on a silicon crystal and the change in the impurity oxygen (Oi) concentration. In the diagram, Curve A of a broken line represents the results of a heat treatment performed at a temperature of 700° C. and preceded by a preannealing treatment performed at 450° C. and Curve B of a solid line represents the results of the same heat treatment not preceded by the preannealing treatment. A comparison of the two curves reveals that the decrease of the impurity oxygen (Oi) concentration is larger in the operation involving the preannealing treatment performed at a temperature of 450° C. (Curve A). The fact that the decrease of the impurity oxygen concentration is large implies that the amount of the oxygen precipitate is large, and this indicates that the preannealing treatment performed at a temperature of 450° C. results in an increase in the concentration of the C—O complex destined to form the seed for oxygen precipitation, and in a consequent increase in the amount of the oxygen precipitate to be produced in the step of heat treatment to be subsequently performed for the growth of the seed for oxygen precipitate.

Note, when the same heat treatment as described above is performed on a silicon crystal having an impurity oxygen (Oi) concentration of 15 ppm and containing no impurity carbon, virtually no oxygen precipitate is produced. This indicates that the C—O complex fulfills the part of the seed for oxygen precipitation in a silicon crystal containing an impurity carbon.

Figure 1:
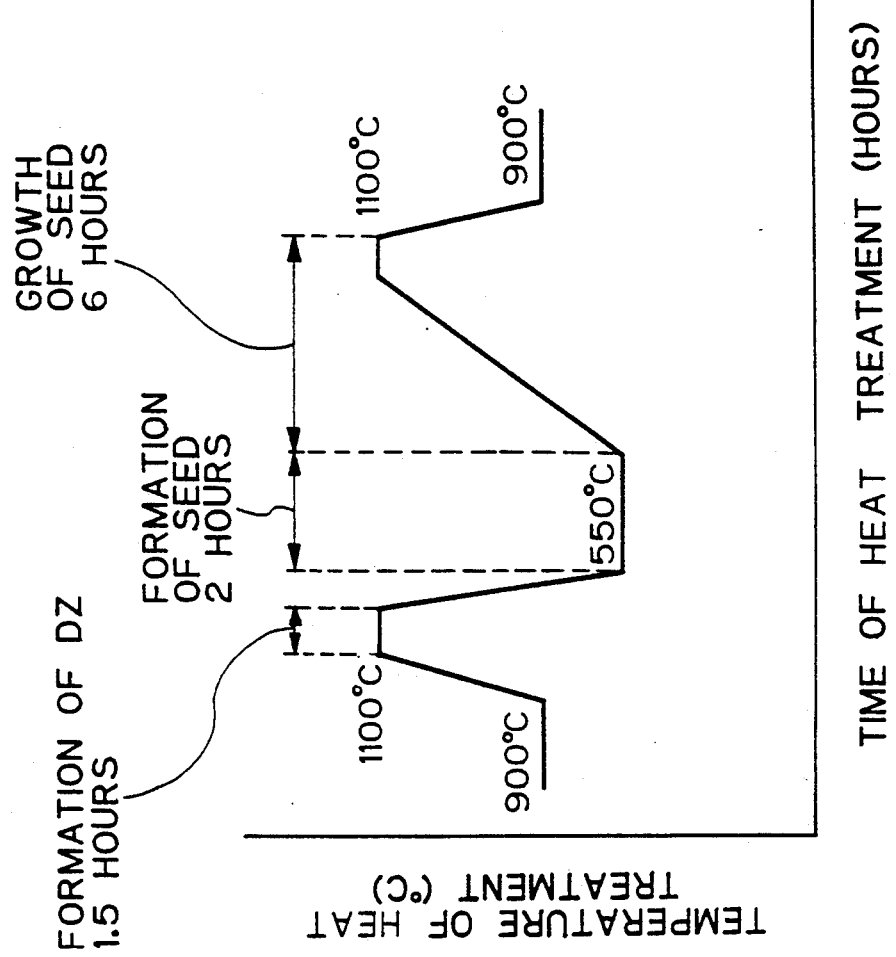
FIG. 1 is a diagram illustrating an embodiment of the process for the IG heat treatment according to the invention.

A heat treatment consisting of the steps illustrated in FIG. 1 is performed on a silicon crystal having an impurity oxygen (Oi) concentration of 15 ppm and an impurity carbon (Cs) concentration of 6 ppm. Specifically, first a heat treatment is performed at a temperature of 1,100° C. for 1.5 hours to form a denuded zone (DZ) on the surface of the silicon crystal and then a heat treatment is performed at 550° C. for two hours to increase the concentration of C—O complex destined to form the seed for oxygen precipitation. Subsequently, the temperature of the silicon crystal is gradually elevated at a temperature increasing rate of 1.8° C./min. to 1,100° C., kept at this level for about one hour to effect growth of the seed of oxygen precipitation and give rise to an intrinsic gettering layer. This elevation of the temperature must be gradual because the C—O complex as the seed for oxygen precipitation is dissociated when the temperature increasing rate is unduly large.

Figure 2:
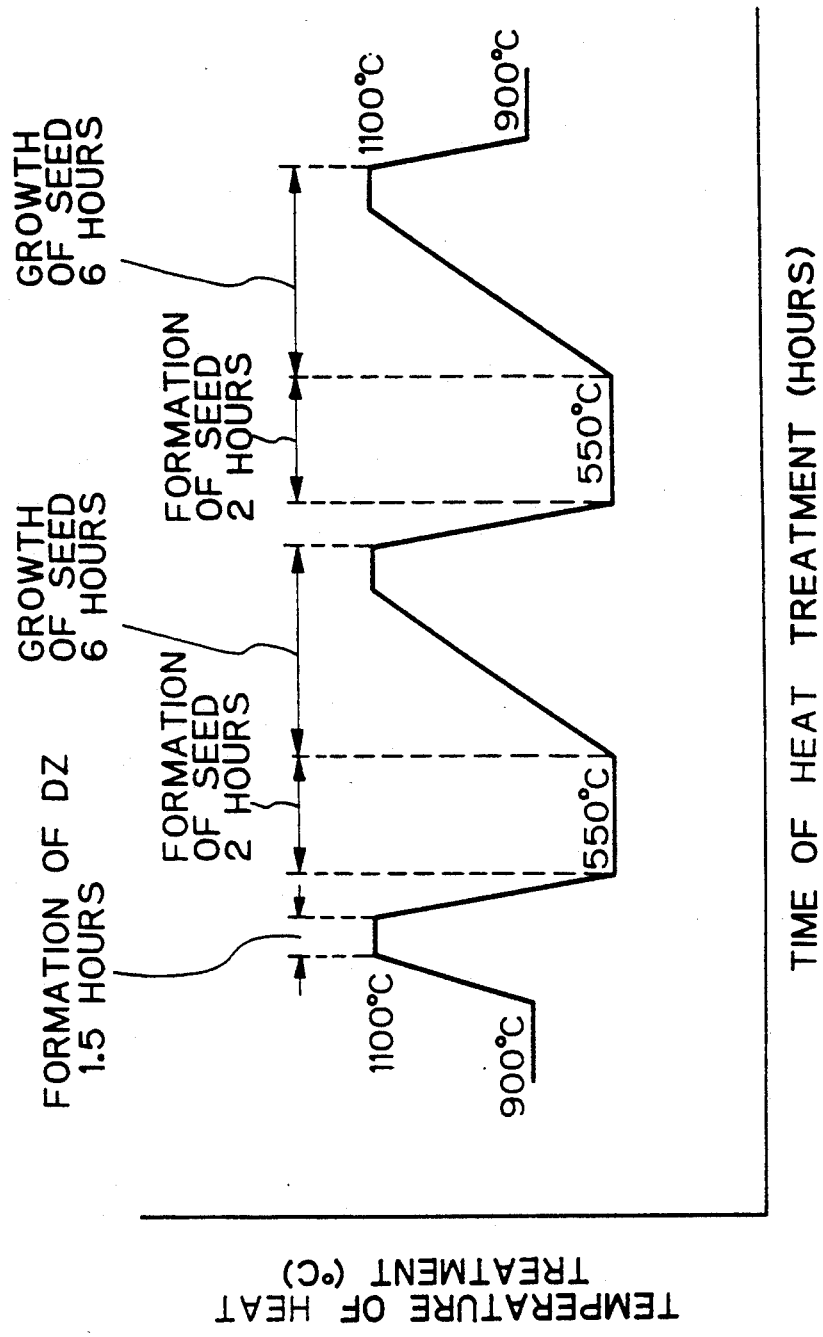
FIG. 2 is a diagram illustrating another embodiment of the process for the IG heat treatment according to the invention.

The amount of the oxygen precipitate can be increased by repeating a plurality of times as illustrated in FIG. 2 the set of the step of heat treatment for increasing the concentration of the C—O complex and the step of heat treatment for growing the seed.

The process of the invention as mentioned above obtains an intrinsic gettering efficiently in a silicon crystal containing impurity carbon because the heat treatment performed on the silicon crystal at a temperature such that it increases to a desired level the concentration of the C—O complex destined to form the seed for oxygen precipitation is followed by the heat treatment for the growth of the seed, and enables production of a semiconductor device having ideal characteristics by using the silicon crystal that has undergone this intrinsic gettering.

The second aspect of the present invention will be illustrated below.

As far as the amount of oxygen precipitation is concerned, no noticeable difference is found between the crystals of high-oxygen and low-carbon concentrations and the crystals of low-oxygen and high-carbon concentrations. Since no appreciable research has been made concerning the effect of carbon on the precipitation of oxygen, the technique for the control of oxygen precipitation in the operation using a crystal of low-oxygen and high-carbon concentrations has not advanced as much as that in the operation using a crystal of high-oxygen and low-carbon concentrations.

The present inventor has found that the thermal properties of the carbon-containing seed for oxygen precipitation (carbon-containing precipitation seed) follow a very simple rule, and further found that the control of the concentration of the carbon-containing precipitation seed is obtained far more simply with a higher accuracy than the control of the concentration of the seed of non-carbon precipitation in the crystals of high-oxygen and low-carbon concentrations. The inventor continued a study based on the idea that the carbon-containing precipitation seed susceptible of control of concentration can be utilized for adjusting the amount of oxygen precipitation in a crystal of low-oxygen and high-carbon concentrations, and the contents of this study are described in detail below.

(1) Utilization of Effect of Carbon on Promotion of Precipitation

A low-oxygen high-carbon crystal which has a fairly large value for the concentration [Cs] of the impurity carbon (Cs) in spite of a small value even short of about 28 ppm for the concentration [Oi] of the impurity oxygen (Oi) is capable of producing an amount of oxygen precipitation enough for carbon to manifest the effect in promoting oxygen precipitation. The amount of oxygen precipitation is larger in a low-oxygen high-carbon crystal in which the concentration [Oi] of the impurity oxygen (Oi) is 22 ppm and the concentration [Cs] of the impurity carbon (Cs) is 7 ppm than in a high-oxygen low-carbon crystal in which the concentration [Oi] of the impurity oxygen (Oi) is 33 ppm and the concentration [Cs] of the impurity carbon (Cs) is not more than 0.5 ppm. The reason for this difference will be described below.

By the thermal random walk, one impurity oxygen atom (Oi) is approximated to an impurity carbon atom (Cs) and trapped by the impurity carbon atom (Cs) to form a carbon-oxygen complex defect (C—O complex defect). Then, another impurity oxygen atom (Oi) is likewise approximated to and trapped by this complex defect. By sequential advance of this process, the complex defect grows into a precipitate. This series of chemical reaction processes proceeding in a solid solution which is called a carbon-containing precipitation may be represented by the following formula (1).

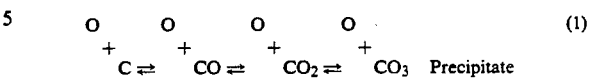

(1)

Since these reactions possibly advance in the reverse direction (dissociation of precipitate), the reactions in the reverse direction are indicated by arrows directed leftwardly. Here, the C—O complex which is formed in the very beginning stage during the process of precipitation constitutes itself the seed for the precipitation that follows. The precipitation of oxygen by this carbon-containing seed for precipitation more than offsets the decline of the precipitation of oxygen caused by the non-carbon seed for precipitation (such as, for example, a complex solely of oxygen atoms). Thus, even in a crystal which only has a low oxygen concentration and a high carbon concentration, the carbon-containing seed for precipitation allows an ample amount of oxygen precipitation. Also from the viewpoint of the amount of precipitation, crystals of low-oxygen and high-carbon raises absolutely no problem and may well be rated as superior to crystals of high-oxygen and low-carbon concentrations.

(2) Switch of Precipitation Mechanism From Non-Carbon Precipitation to Carbon-Containing Precipitation It is inferred that, in the aforementioned low-oxygen high-carbon crystal having 22 ppm for the concentration [Oi] of the impurity oxygen (Oi) and 7 ppm for the concentration [Cs] of the impurity carbon (Cs), the non-carbon seed for precipitation has virtually no part and the carbon-containing seed for precipitation has practically the whole part in the oxygen precipitation. This inference is based on the observation that the heat treatment performed under the conventional conditions brings about virtually no precipitation of oxygen where the concentration [Oi] of the impurity oxygen (Oi) is equally 22 ppm and the concentration [Cs] of the impurity carbon (Cs) is not more than 0.5 ppm. By using the low-oxygen high-carbon crystal as described above, therefore, the initial stage during the reaction of precipitation can be switched from the non-carbon precipitation to the carbon-containing precipitation indicated by the formula (1).

(3) New Method For Control of Carbon-Containing Seed for Precipitation

The control of the precipitation of oxygen in the low-oxygen high-carbon crystal is effected by controlling the concentration of the C—O complex defect which forms the carbon-containing precipitation seed. It has been found that the control of the concentration of the C—O complex defect is accomplished far more easily with a decisively high accuracy than the control of the non-oxygen precipitation seed in the high-oxygen low-carbon catalyst.

Figure 11:
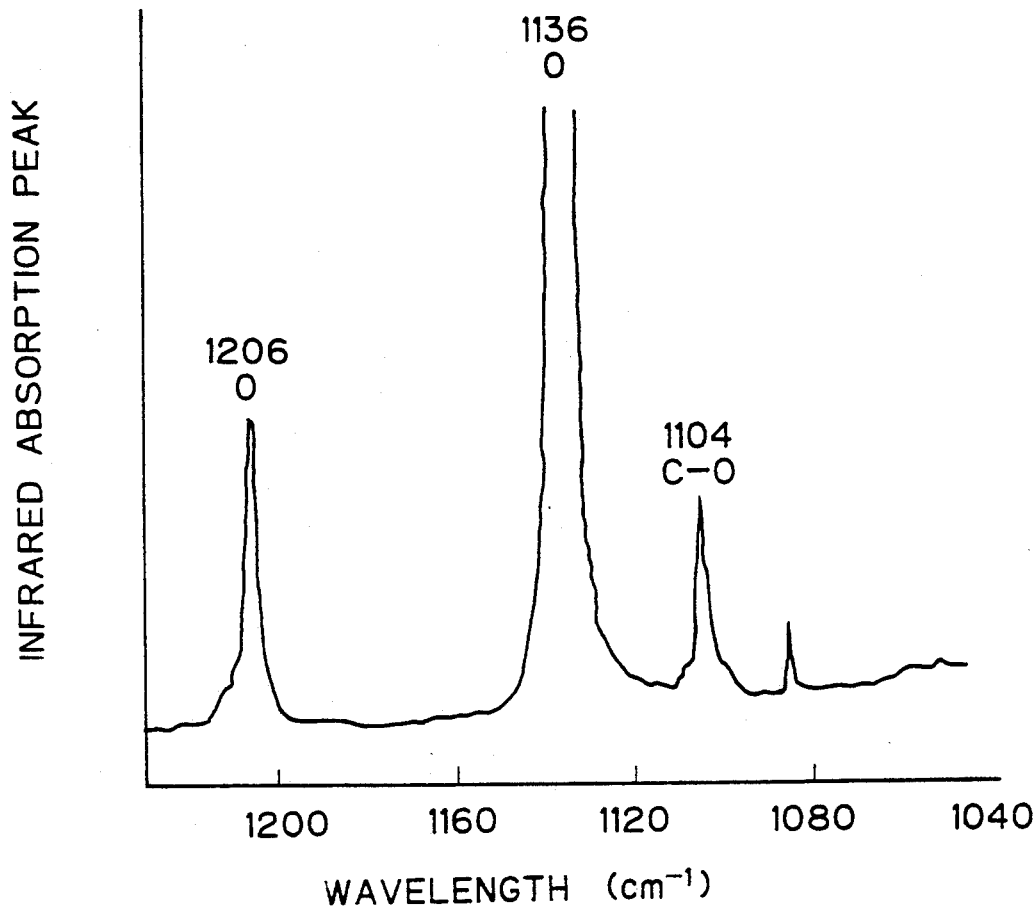
FIG. 11 is a diagram of infrared absorption peaks obtained by a low-temperature infrared absorption method, showing an infrared absorption peak of a C—O complex defect at a wave number of 1,104 cm$^{-1}$.

Although the non-carbon seed for precipitation is generally unobservable, the C—O complex defect which forms the carbon-containing seed for precipitation can be directly perceived and quantitatively analyzed by the method of low-temperature infrared absorption. It is known that a typical form of the C—O complex defect produces an infrared absorption peak at a wavenumber of 1,104 cm$^{-1}$ as shown in FIG. 11 at the temperature of liquefied helium (R. C. Newman, Journal of Phys. and Chem. of solids, 1772, Vol. 30, pp. 255–268). From the integrated intensity of the C—O peak at the wavenumber of 1,104 cm$^{-1}$, the concentration of a given C—O complex defect can be determined by using the coefficient of conversion, 1.53 ppm.cm$^{-2}$, of the ratio between the peak area intensity obtained separately by the inventor and the concentration of the C—O complex defect.

The C—O complex defect is formed by the reaction indicated by the formula (2), which represents the initial stage during the series of chemical reactions in the solid solution indicated by the formula (1).

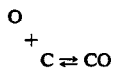

(2)

Figure 6:
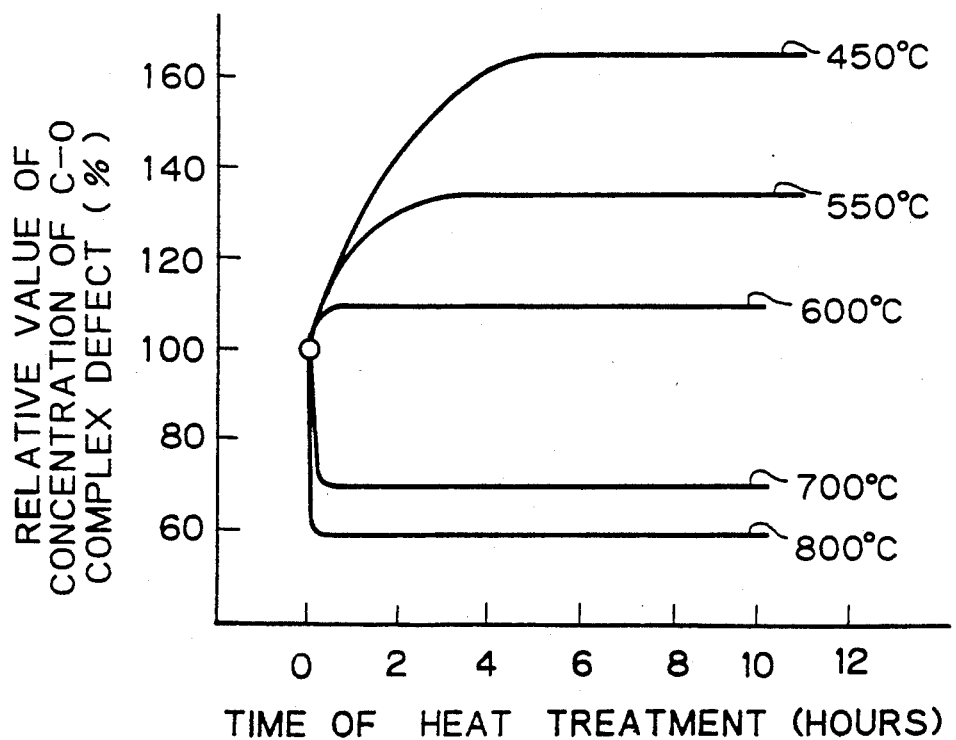
FIG. 6 is a graph showing the relationship between the concentration of C—O complex defect and the time of heat treatment, with the temperature of the heat treatment as a parameter.

When the low-oxygen high-carbon crystal of the ordinary grade having about 22 ppm for the concentration [Oi] of the impurity oxygen (Oi) and about 7 ppm for the concentration [Cs] of the impurity carbon (Cs) is subjected to a heat treatment as generally practiced, the concentration of the C—O complex defect formed in the initial reaction process indicated by the formula (2) shows a dependency on the temperature and the duration of the heat treatment as illustrated in FIG. 6. After starting the heat treatment, the concentration of the C—O complex defect reaches a fixed value which depends on the temperature of the heat treatment. The C—O complex defect of the concentration [CO] which is formed in this initial reaction constitutes itself the carbon-containing precipitation core for inducing the growth of the oxygen precipitate in the heat treatment to be executed subsequently. It has been demonstrated that the relation, [CO] $\propto$ [Oi] $\times$ [Cs], exists among the concentration [CO] of the C—O complex defect after the initial reaction, the concentration [Oi] of the impurity oxygen (Oi), and the concentration [Cs] of the impurity carbon (Cs).

Figure 7:
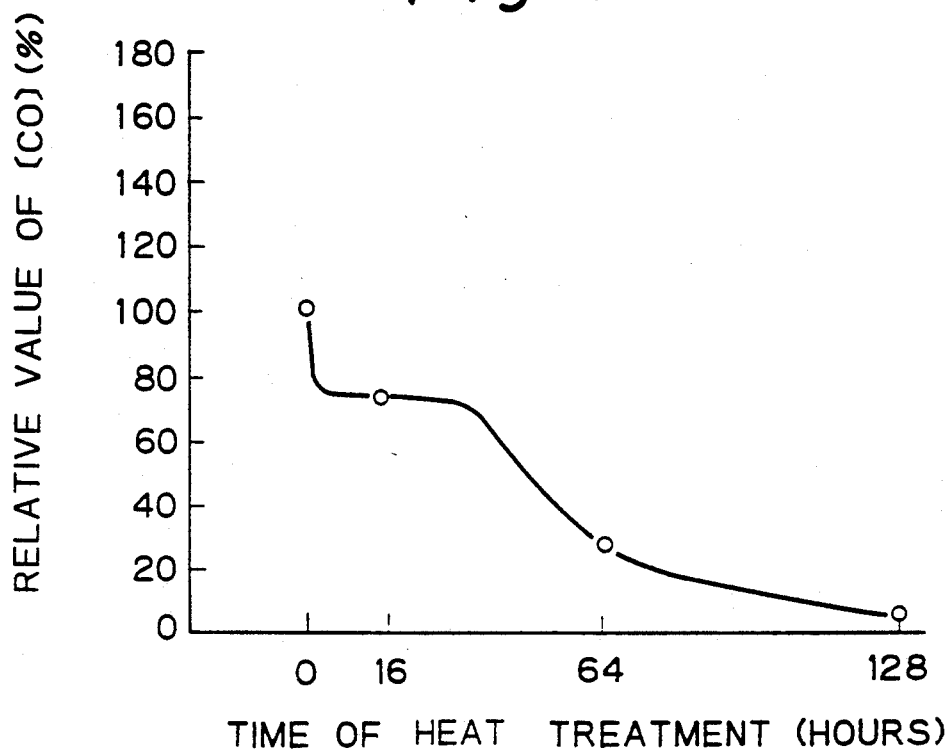
FIG. 7 is a graph showing the relationship between the concentration of C—O complex defect and the time of heat treatment, obtained in an experiment performing the heat treatment at a temperature of 700° C.
Figure 8:
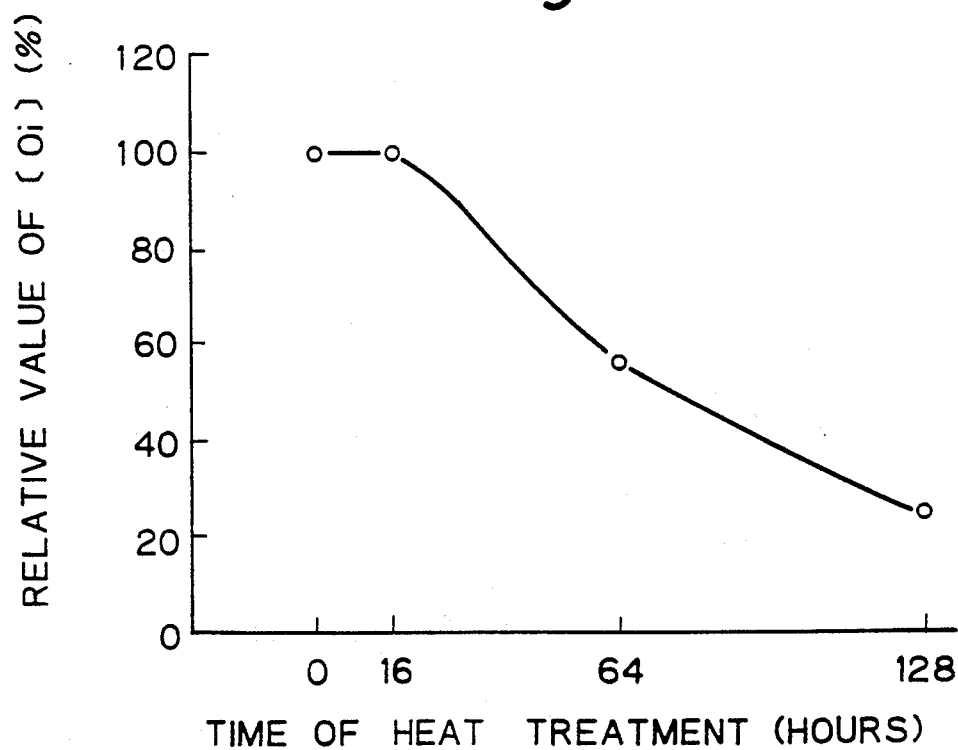
FIG. 8 is a graph showing the relationship between the concentration of impurity oxygen and the time of heat treatment, obtained in an experiment performing the heat treatment at a temperature of 700° C.
Figure 9:
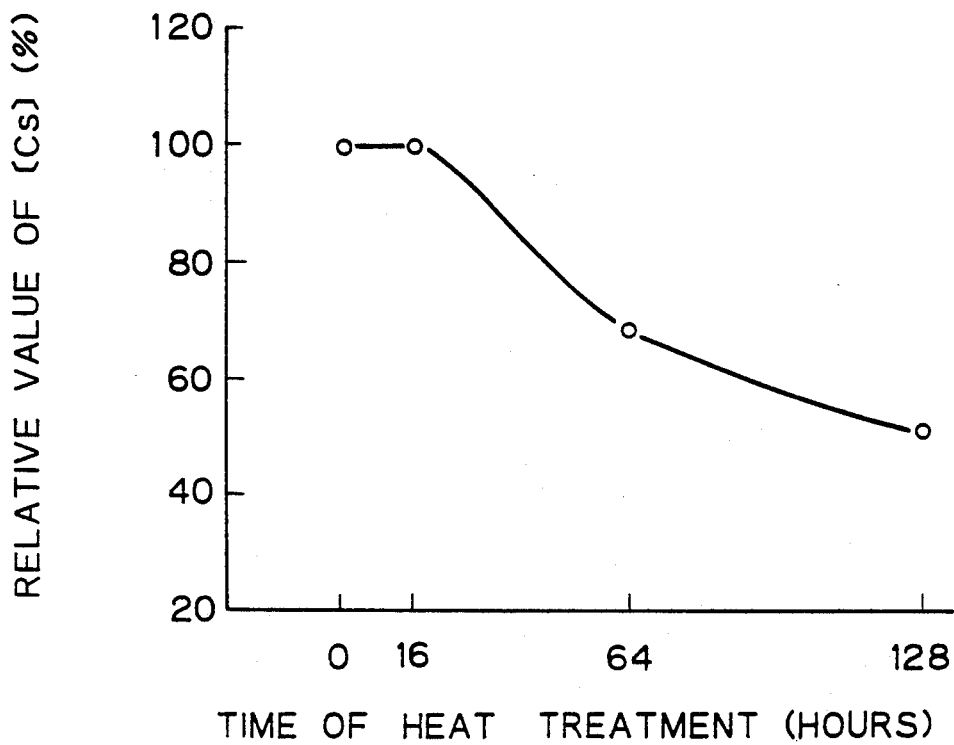
FIG. 9 is a graph showing the relationship between the concentration of impurity carbon and the time of heat treatment, obtained in an experiment performing the heat treatment at a temperature of 700° C.
Figure 10:
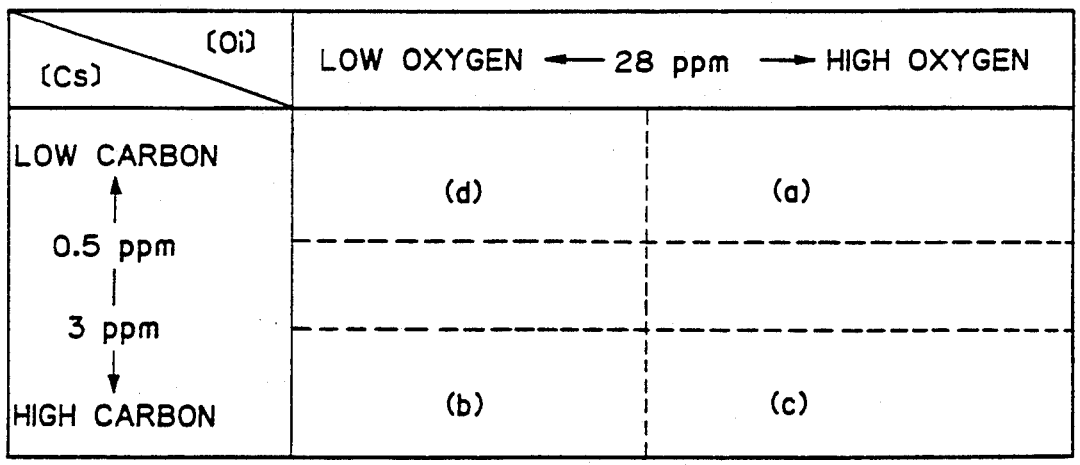
FIG. 10 is a diagram classifying silicon crystals by concentration of impurity oxygen (Oi) and concentration of impurity carbon (Cs).

The changes by aging of the concentration [CO] of the C—O complex defect, the concentration [Oi] of the impurity oxygen (Oi), and the concentration [Cs] of the impurity carbon (Cs) which are observed when the heat treatment for the oxygen precipitation is carried out at a temperature of 700° C. for a long time are shown respectively in FIG. 7, FIG. 8, and FIG. 9. The concentration [Oi] of the impurity oxygen (Oi) and the concentration [Cs] of the impurity carbon (Cs) shown herein were determined in accordance with the ordinary low-temperature infrared absorption method using infrared absorption peaks at the wavelengths of 1,106 cm$^{-1}$ and 607 cm$^{-1}$.

The concentration [CO] of the C—O complex defect, as shown in FIG. 7, reaches a fixed value which relies on the temperature of the heat treatment after starting the heat treatment. The phenomenon occurs as has already been described above with reference to FIG. 6. Then, the concentration, after remaining at this fixed level, begins to fall. At the same time, the concentration (Oi) of the impurity oxygen (Oi) and the concentration [Cs] of the impurity carbon (Cs) both begin to fall as shown in FIG. 8 and FIG. 9. This indicates that a precipitation of oxygen is proceeding during this time. Here again, the relationship [CO] $\propto$ [Oi] $\times$ [Cs] is established.

From the results of the test described above, the following conclusion can be drawn.

The initial reaction of the formula (2) is a component process which occurs very quickly in the whole process of the carbon-containing precipitation reaction indicated by the formula (1). The energy barrier of the reaction indicated by the formula (2) is decisively lower than the energy barrier of any of the reactions indicated in the formula (1). It is safe to conclude, therefore, that after the elapse of 10 minutes to one hour following the start of the heat treatment, the reaction of the formula (2) assumes the thermal equilibrium state which varies from moment to moment. In other words, the relationship indicated by the formula (3) is established from moment to moment.

$$[CO] = A \times [Oi] \times [Cs] \qquad (3)$$

wherein A stands for the coefficient which relies solely on the temperature of the heat treatment, providing that the numerical value of the coefficient is expressed by the denomination of 1/ppm, and the coefficient has a relationship indicated by the formula (4) with the temperature T (°C.) of the heat treatment.

$$1,000/(T+273) = \log_{10} A + 3.9 \qquad (4)$$

Since crystals have their own thermal hystereses (conditions of production) different from one to another, the concentrations [CO] of C—O complex defects as carbon-containing precipitation seeds in the crystals generally deviate largely from the prescribed value and are dispersed among the crystals. When the crystals in this state are introduced without any modification into the process of device production, the amounts of oxygen precipitation which occur in the individual crystals are dispersed proportionately to the dispersion in the concentrations of carbon-containing seeds for precipitation even if the crystals have the same concentration [Oi] of impurity oxygen (Oi) and the same concentration [Cs] of impurity carbon (Cs). This dispersion in the amounts of oxygen precipitation is identical with that which occurs in the high-oxygen low-carbon crystals owing to the non-carbon seeds for precipitation.

To preclude the dispersion of the amounts of oxygen precipitation, the concentrations [CO] of the C—O complex defects designed to serve as carbon-containing seeds for precipitation must be equalized to a prescribed value before the actual device production is started. The adjustment of the concentrations [CO] of the C—O complex defects of the crystals to a desired value can be accomplished by determining the concentrations [Oi] of impurity oxygen (Oi) and the concentrations [Cs] of impurity carbon (Cs) in the crystals, calculating the formula (3) using the numerical values resulting from the determination and the desired concentration [CO] of the C—O complex defect thereby finding the coefficient A, then calculating the formula (4) using the coefficient A found as above, to thereby find the temperature T of the heat treatment, and carrying out a heat treatment at this temperature T.

The time, t, of the heat treatment to be performed at the temperature T for the adjustment of the concentrations [CO] of the C—O complex defects can be selected so as to satisfy the formula (5).

$$t = B\{1 - \exp(-C/T)\} \qquad (5)$$

wherein B and C stand for the constants for giving 0.3 hour and four hours as the time t respectively for 1,000° C. and 500° C. as the temperature T.

As described above, the concentrations [CO] of the C—O complex defects which form carbon-containing seeds for precipitation can be adjusted to a prescribed value at the outset of the actual device production by using the concentrations [Oi] of impurity oxygen (Oi) and the concentrations [Cs] of impurity carbon (Cs), which are observable, and the conditional formulas (3), (4), and (5), which are precise. As a result, the otherwise inevitable dispersion in the amount of oxygen precipitation in the subsequent heat treatment can be eliminated, the control of the amount of oxygen precipitation can be stabilized, and the controllability of the intrinsic gettering effect can be heightened.

The process for the intrinsic gettering heat treatment as one embodiment of the invention will be described below.

First, a plurality of sample crystals were taken from one silicon crystal ingot.

When these sample crystals were analyzed for concentration [Oi] of impurity oxygen (Oi) respectively and concentration [Cs] of impurity carbon (Cs) by the conventional low-temperature infrared absorption method using infrared absorption peaks of 1,106 cm$^{-1}$ and 607 cm$^{-1}$, substantially uniform values approximating 22 ppm and 7 ppm respectively were obtained for the concentration [Oi] of impurity oxygen (Oi) and the concentration [Cs] of impurity carbon (Cs).

Then, the sample crystals were analyzed by the use of a Fourier transformation type infrared absorption tester to find the areas of infrared absorption peaks at a wave number of 1,104 cm$^{-1}$ at the temperature of liquefied helium and determine the concentration [CO] of C—O complex defect using the coefficient of conversion of 1.53 ppm.cm$^{-2}$. The results were dispersed in the range of from 0.4 to 0.5 ppm.

When the sample crystals were heat treated at 850° C., the temperature found by performing calculations of the formulas (3) and (4), for 30 minutes, the time found by performing the calculation of the formula (5), for equalizing the concentrations [CO] of the C—O complex defects in the sample crystals, the concentrations [CO] of the C—O complex defects of all the sample crystals were uniformized at 0.3±0.03 ppm.

Then, the sample crystals were heat treated at a temperature of 600° C. for three hours and subsequently at a temperature of 1,050° C. for five hours for causing precipitation of oxygen. The amounts of oxygen percipitation obtained in all the sample crystals were invariably in the range of 12±0.3 ppm.

In the set of sample crystals which had not undergone the aforementioned heat treatment for the uniformization of the concentrations of carbon-containing precipitation seeds, the amounts of oxygen percipitation obtained in consequence of the same process of heat treatment for oxygen precipitation were dispersed in the range of from 10 to 12 ppm proportionately to the concentrations [CO] of C—O complex defects existing before the heat treatment.

In accordance with the process of the invention as mentioned above, in the intrinsic gettering heat treatment for the precipitation of impurity oxygen contained in silicon crystals, the amounts of oxygen precipitation in all the silicon crystals having different concentrations of carbon-containing precipitation seed defects due to the difference of thermal hysteresis at the time of production can be equalized to a prescribed value by preparatorily adjusting to a prescribed value the concentrations of carbon-containing precipitation seed defects destined to form seeds for oxygen precipitation as described above. The process of the invention, therefore, contributes immensely to enhancing the quality of a semiconductor device, improving the yield of semiconductor devices to be produced, and consequently, lowering the cost of production in a large measure.

The third aspect of the present invention will be described below.

In this invention, the selection of silicon crystals mentioned above may be effected by comparing the intensities of infrared absorption peaks relative to the time spent for the heat treatment.

In this invention, the lower limit of the concentration of impurity carbon is set at 1 ppm because it forms the lowest possible coundary for the detection of an absorption peak due to the C—O complex. The upper limit is only required to be below the solid solution limit.

The dispersion of the amount of oxygen precipitation in a silicon crystal is ascribable to the fact that the state of crystal defect is varied because the thermal hysteresis exerted on the silicon crystal is varied. In the case of a silicon crystal containing no carbon, it is extremely difficult to discern this variation in the crystal defect. This invention, therefore, offers the following description with respect to a carbon-containing silicon crystal which allows a visual discernment of variations in the state of a crystal defect.

Figure 12:
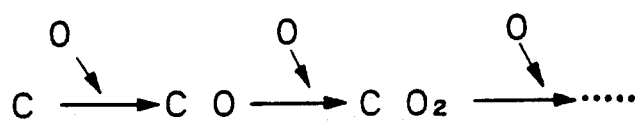
FIG. 12 is a diagram showing the manner in which interstitial oxygen atoms approximate substitution type carbon atoms and give rise to carbon-oxygen complexes.

First, the process of oxygen precipitation in a high-carbon silicon crystal having a high carbon concentration will be described. FIG. 12 is a diagram depicts the manner in which interstitial oxygen atoms approximate substitution type carbon atoms and give rise to carbon-oxygen complexes.

In the silicon crystal, carbon atoms occupy lattice points as substitution type impurities and oxygen atoms assume their positions between the lattices of silicon bonds. The interstitial oxygen atoms, on being heat-treated, are approximated to substitution type carbon atoms and caused to form carbon-oxygen complex defects and these complex defects are caused to gather oxygen atoms and give rise to precipitation of oxygen as illustrated in FIG. 12. These carbon-oxygen complex defects can be observed by the infrared absorption method. In a silicon crystal containing no carbon, such carbon-oxygen complex defects as mentioned above cannot be observed by the infrared absorption method. The data obtained of this silicon crystal by the infrared absorption method, therefore, give no discernible proof indicative of thermal hysteresis.

Figure 13:
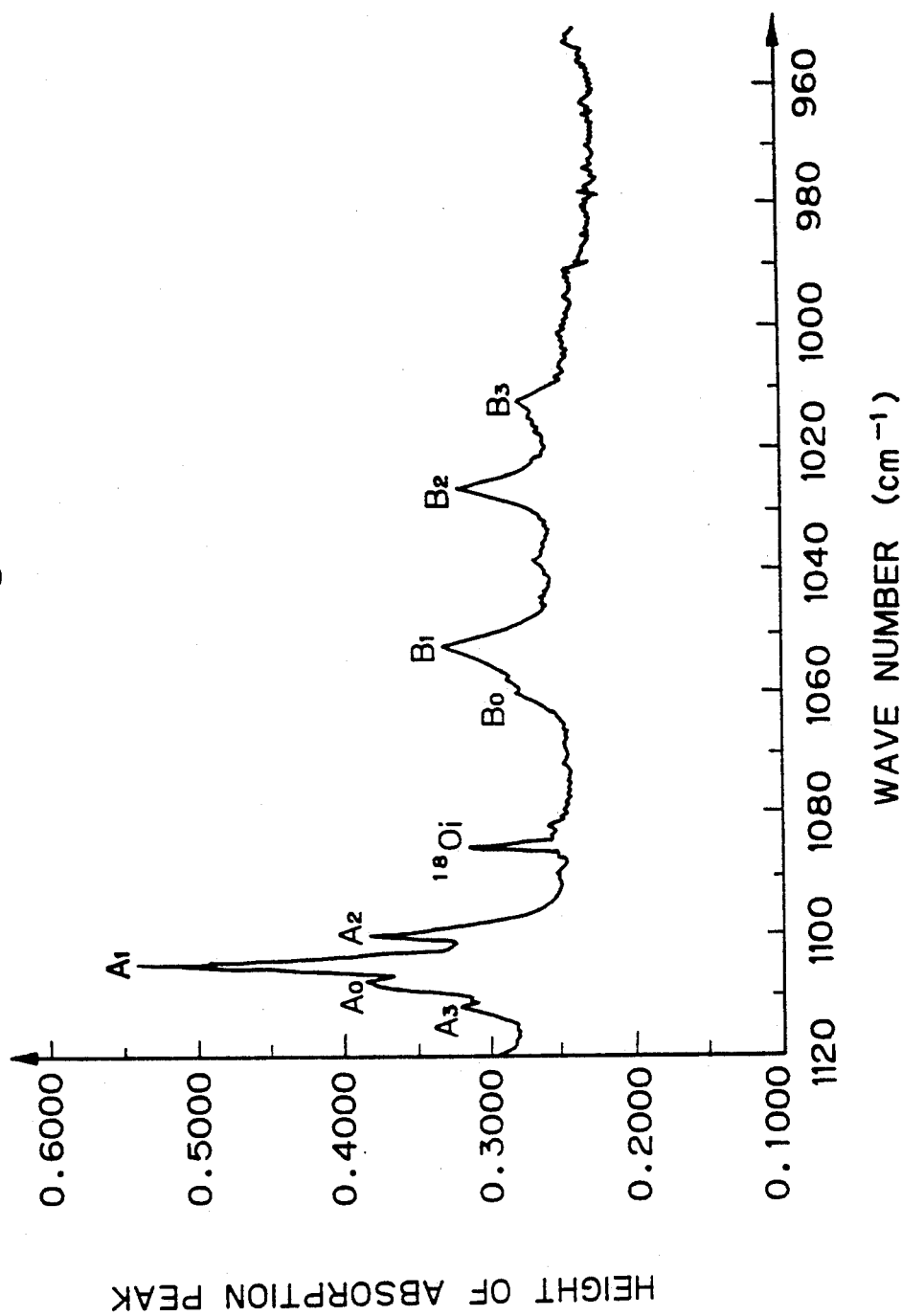
FIG. 13 is a diagram showing an infrared absorption spectrum obtained at the liquefied helium temperature of a carbon-containing silicon crystal after a heat treatment at a low temperature (500° C.).

FIG. 13 is a diagram showing an infrared absorption spectrum obtained at the liquefied helium temperature of a silicon crystal having an oxygen concentration of 20 ppm and a carbon concentration of 5 ppm after 12 hours' heat treatment at a low temperature of 500° C. the infrared absorption peaks $A_0$, $A_1$, $A_2$, $A_3$, $B_0$, $B_1$, $B_2$, and $B_3$ originate in the C—$O_n$ complexes (complex defects formed of one carbon atoms and n oxygen atoms). In this case, the peaks gathering in the same absorption bands can be divided into two groups, Group A ($A_0$ to $A_3$) and Group B ($B_0$ to $B_3$).

Figure 14:
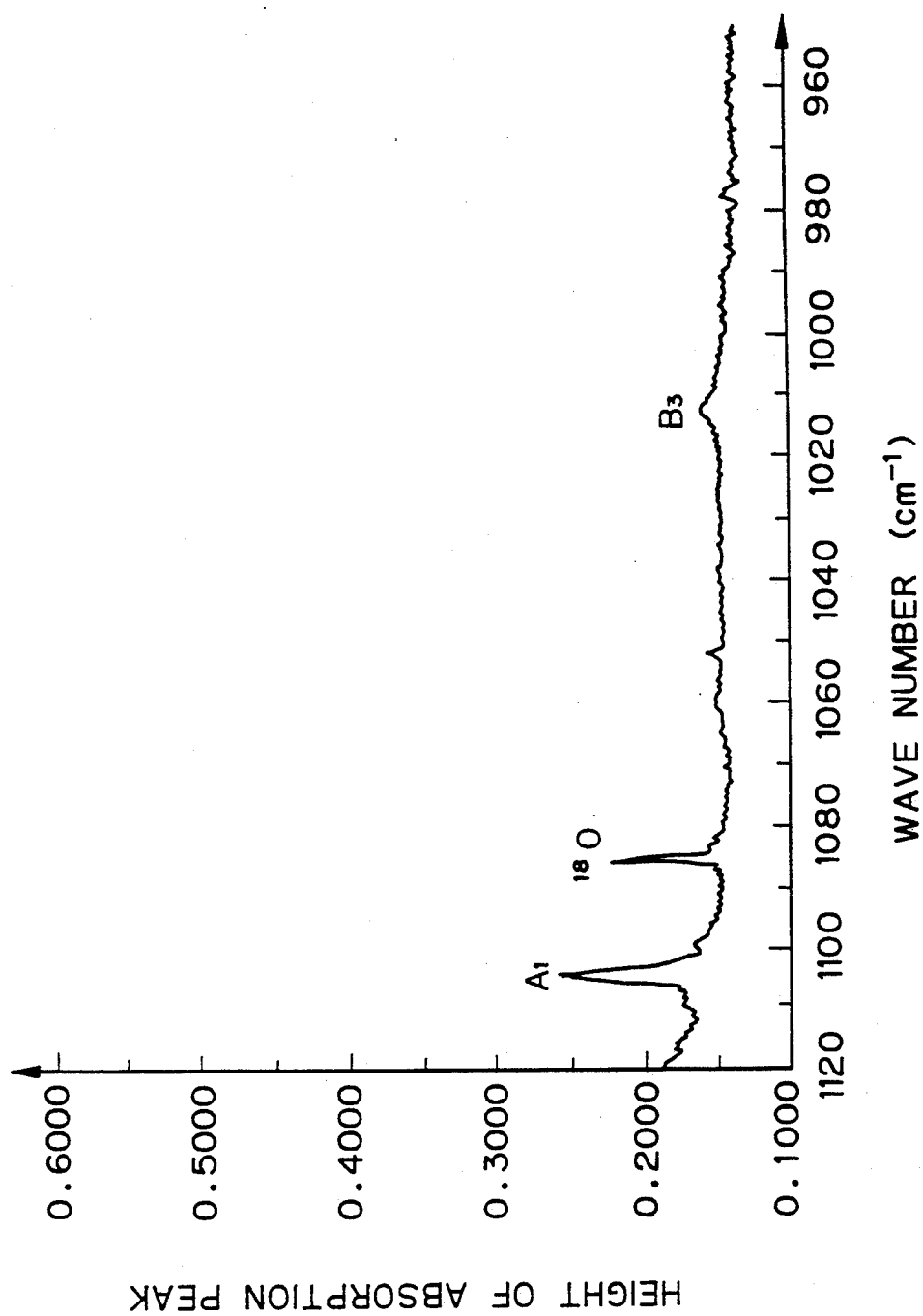
FIG. 14 is a diagram showing an infrared absorption spectrum obtained at the liquefied helium temperature of a carbon-containing silicon crystal after a heat treatment at a high temperature (750° C.).

FIG. 14 is a diagram showing an infrared absorption spectrum obtained at the liquefied helium temperature of the same crystal as mentioned above after one hour's heat treatment at a high temperature of 750° C. Here, Peak $A_1$ is an absorption peak by the $C-O_1$ complex. The spectrum clearly indicates that other absorption peaks were eliminated substantially completely by the heat treatment at such a high temperature as 750° C. It has been experimentally demonstrated by the inventors that the intensity of the peak of $A_1$ normalized by the product of the concentrations of oxygen and carbon in the crystal is a magnitude which depends solely on temperature. The method of evaluating crystals based on the absorption peaks has been already reported.

The invention, therefore, contemplates evaluating the thermal hysteresis of the crystal on the basis of all the infrared absorption peaks $A_0$ to $A_3$ and $B_0$ to $B_3$ in the 1,120 to 1,000 $cm^{-1}$ zone originating in the C—O complexes as illustrated in FIG. 13. Since these peaks are observed in the low temperature range not exceeding 600° C., they are particularly effective in the evaluation of a crystal possessing a low-temperature thermal hysteresis.

Figure 15:
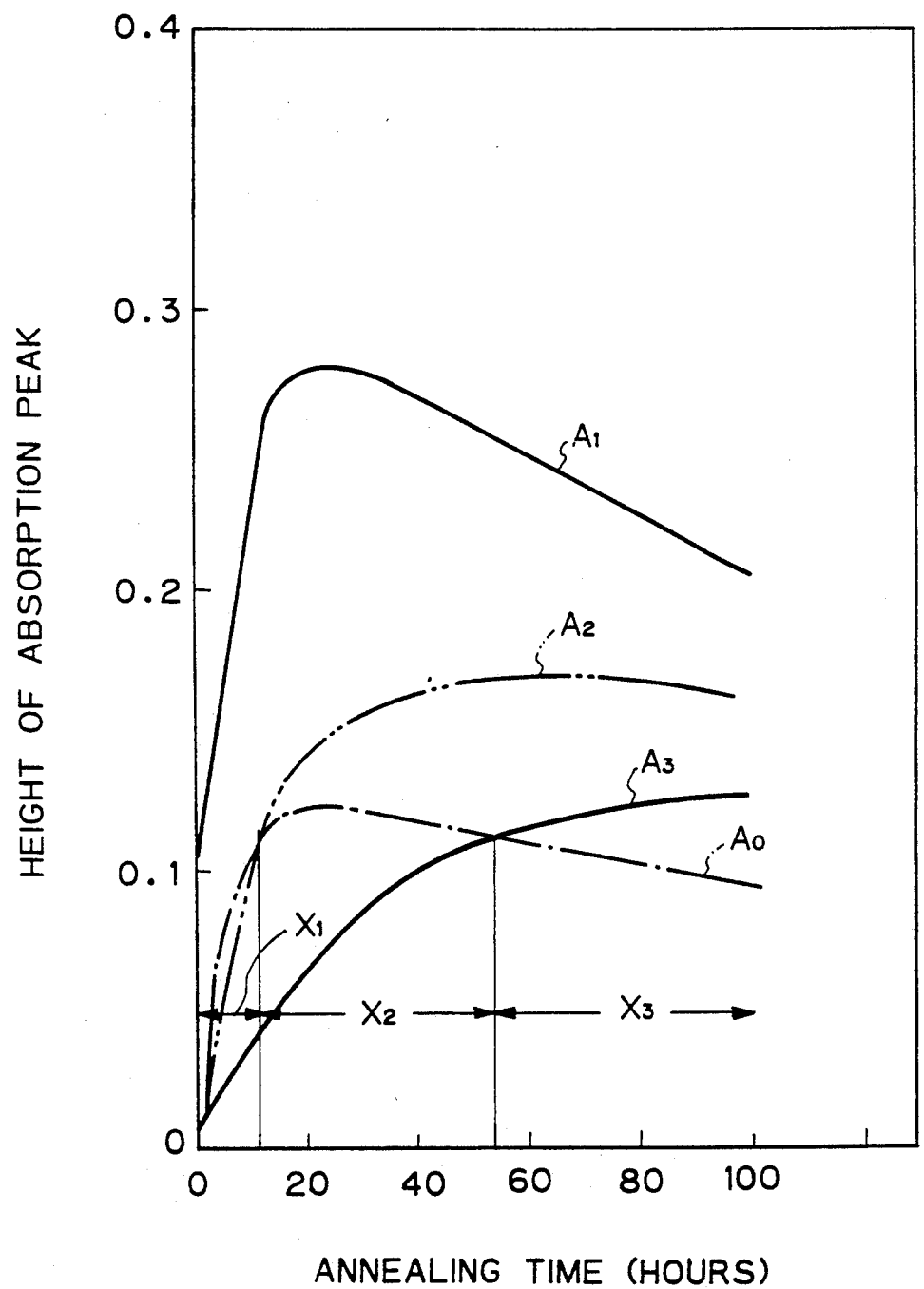
FIG. 15 is a diagram showing time-course changes of infrared absorption peaks of Group A during a heat treatment performed at a fixed temperature of 500° C.
Figure 16:
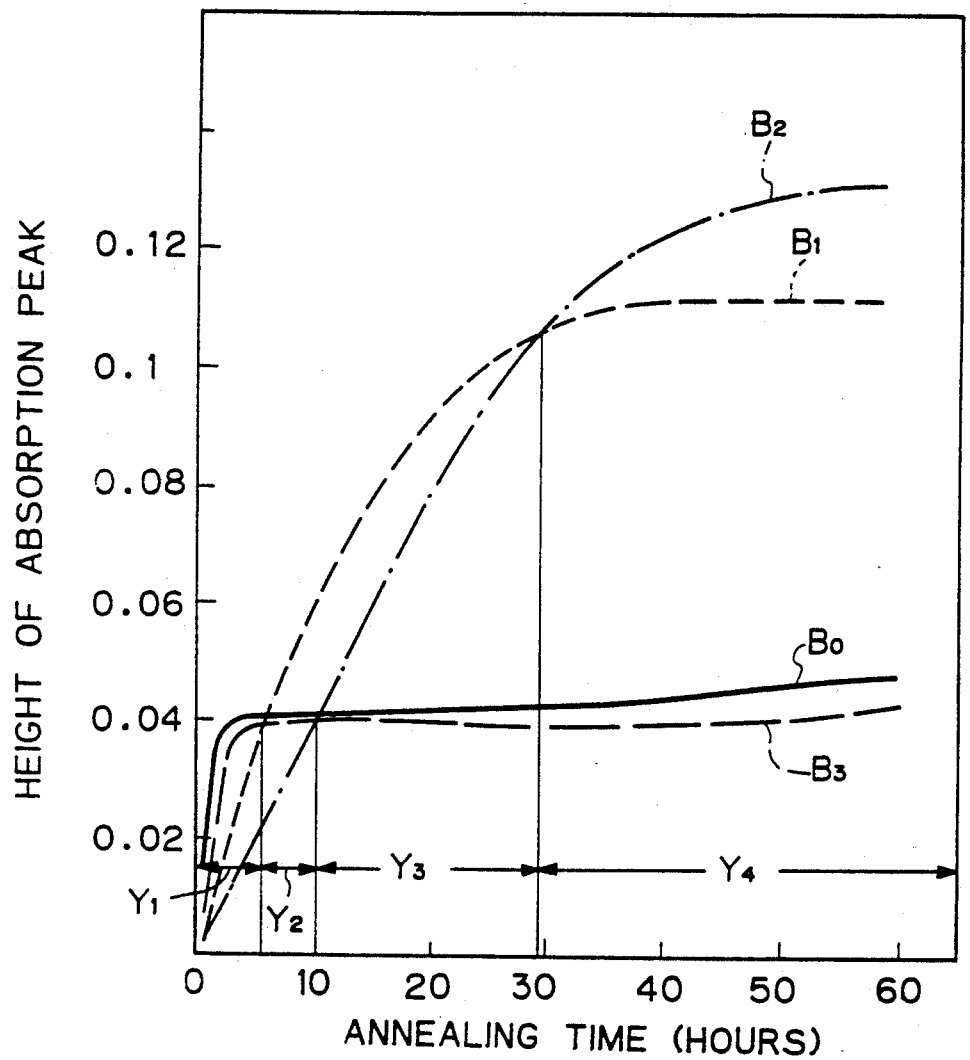
FIG. 16 is a diagram showing time-course changes of infrared absorption peaks of Group B during a heat treatment performed at a fixed temperature of 500° C.

Then, FIG. 15 and FIG. 16 are diagrams showing time-course changes of the infrared absorption peaks of Group A and Group B during the course of a heat treatment performed at a fixed temperature of 500° C. As clearly noted from FIG. 15 and FIG. 16, since the intensities of the absorption peaks exhibit different behaviors to varying annealing times, an inversion of the peak intensity occurs at certain annealing times. By dividing the whole period of the heat treatment at the annealing times as the sites of peak inversion and comparing the peak intensities in the divided time zones, therefore, the thermal hysteresis (defective state) in the crystal can be divided into $X_1$, $X_2$, and $X_3$ in Group A and into $Y_1$, $Y_2$, $Y_3$, and $Y_4$ in Group B, for example. Here, the time-course changes of peaks were determined within the span of 100 hours because the annealing to which a silicon crystal in actually subjected is performed within 100 hours.

FIGS. 17(a) and (b) are diagrams showing the relative magnitudes (sequence) of the infrared absorption peak intensities of Group A and Group B in separate heat treatment time zones.

Thus, in the invention, the heat treatment can be divided into three time zones of $X_1$, $X_2$, and $X_3$ with respect to Group A and into four time zones of $Y_1$, $Y_2$, $Y_3$, and $Y_4$ in Group B. By using at least either one of the two kinds of time zones, therefore, the evaluation (classification) of the thermal hysteresis (defective state) of the silicon crystal can be accomplished. The control of oxygen precipitation can be obtained with the heretofore unattainable high accuracy and therefore, by performing the heat treatment only on such crystals of one and the same sort or only on such crystals of mutually approximating sorts among other silicon crystals separated by the classification. Thus, the otherwise inevitable dispersion of the gettering ability among Si substrates can be precluded.

Now, the process will be specifically described with reference to working examples.

When two sample crystals were taken from one silicon crystal ingot, the two samples showed identical oxygen concentrations of about 22 ppm and identical carbon concentrations of 6 ppm. In accordance with the classification indicated in FIG. 17 (a), one of the two samples turned out to be a crystal of $X_1$ and the other to be a crystal of $X_2$. When these crystals were subjected to an actual heat treatment for oxygen precipitation (three hours at 550° C.+five hours at 1,050° C.), they produced a difference of 17% in the amount of oxygen precipitation (amount of oxygen precipitate: 12 ppm in $X_1$ crystal and 10 ppm in $X_2$ crystal).

In contrast to the comparative experiment cited above, in the working example, two sample crystals both of $X_1$ taken one each from two ingots having identical impurity concentrations and different entities were subjected to the same heat treatment for oxygen precipitation as described above and were analyzed to determine the amounts of oxygen precipitate. The difference between the amounts was found to be within 5%.

In the present working example, since crystals were separated by measuring infrared absorption peak intensities of carbon-containing sample crystals at a low temperature and comparing the found infrared absorption peak intensities and two crystals both of $X_1$ singled out of the selected crystals were subjected to one and the same heat treatment for oxygen precipitation, the amounts of oxygen precipitation could be controlled with high accuracy as evinced by a conspicuous decrease in variation of the amount of oxygen precipitation from 17% (comparative experiment) to 5% (working example). As a result, the otherwise inevitable dispersion of the gettering ability among substrates was curbed.

The invention as mentioned above is effective in controlling the amount of oxygen precipitation in silicon crystal with a high accuracy, decreasing the dispersion of the gettering ability, and contributing in a large measure to an improvement of the quality of a semiconductor device and an enhancing of the production stability.

We claim:

1. A process for the production of a semiconductor device, comprising a step of performing a heat treatment at a temperature of from 950° C. to 1,250° C. for a period of from one to four hours on a silicon crystal having an impurity carbon concentration exceeding 1.0 ppm and not exceeding the solid solution limit to thereby form a denuded zone therein, a step of performing a heat treatment at a temperature of from 350° C. to 600 ° C. for a period of one to 24 hours on said silicon crystal having said denuded zone formed therein to thereby form a complex defect of impurity oxygen and impurity carbon therein, and a step of performing a heat treatment on said silicon crystal having said complex defect formed therein by the elevation of the temperature of said silicon crystal at a temperature increasing rate such that no core effect is broken to a level of from 900° C. to 1,250° C. to thereby effect an intrinsic gettering.

2. A process according to claim 1, wherein the temperature increasing rate is from 0.2° to 3.0° C./min.

3. A process according to claim 1, wherein the set of the step of performing a heat treatment at a temperature of from 350° C. to 600° C. for a period of one to 24 hours on said silicon crystal and the step of performing a heat treatment on said silicon crystal by the elevation of the temperature of said silicon crystal at a temperature increasing rate such that no core defect is dissociated to a level of from 900° C. to 1,250° C. is repeated a plurality of times.

4. A process according to claim 3, wherein the temperature increasing range is from 0.2° to 3.0° C./min.

5. A process for the production of a semiconductor device by an intrinsic gettering heat treatment of a silicon crystal, comprising analyzing a silicon crystal to thereby determine the concentration of impurity oxygen [Oi] and the concentration of impurity carbon [Cs] contained therein, calculating the expression:

$$A = \frac{[CO]}{[Oi] \times [Cs]}$$

wherein A stands for the coefficient for determining the temperature of a heat treatment to be performed on said silicon crystal, providing that the numerical value of said coefficient is expressed by the denomination of 1/ppm and [CO] stands for the desired concentration of a C—O complex generated within said silicon crystal in consequence of said heat treatment to thereby find the coefficient A for determining the temperature of the heat treatment, calculating the expression, $1,000/(T+273) = \log_{10} A + 3.9$, wherein T stands for the temperature (°C.) of the heat treatment to be performed on said silicon crystal to thereby find the temperature T for the heat treatment to be performed on said silicon crystal, performing a heat treatment at said temperature T for a period not exceeding four hours on said silicon crystal to adjust the concentration of a C—O complex defect contained in said silicon crystal, and thereafter, performing a heat treatment for a precipitation of oxygen.

6. A process according to claim 5, wherein the C—O complex defect is perceived and quantitatively analyzed by a method of low-temperature infrared absorption.

7. A process according to claim 5, wherein a concentration of the C—O complex defect is determined from an integrated intensity of a C—O infrared absorption peak at a wavelength of 1,104 $cm^{-1}$.

8. A process according to claim 5, wherein the time, t, required for the step of heat treatment performed at the temperature T to adjust the concentrations of said C—O complex defect is decided by calculating the expression, $t = B\{1 - \exp(-C/T)\}$, wherein B and C stand for constants for giving 0.3 hour and four hours as the time t respectively for 1,000° C. and 500° C. as the temperature T.

* * * * *

UNITED STATES PATENT AND TRADEMARK OFFICE
CERTIFICATE OF CORRECTION

PATENT NO. : 5,286,658
DATED : February 15, 1994
INVENTOR(S) : SHIRAKAWA et al.

It is certified that error appears in the above-indentified patent and that said Letters Patent is hereby corrected as shown below:

Col. 14, line 47, change "core effect is broken" to --complex defect is dissociated--;
line 58, change "core" to --complex--.

Signed and Sealed this

Fourth Day of October, 1994

Attest:

BRUCE LEHMAN

Attesting Officer

Commissioner of Patents and Trademarks